United States Patent [19]
Sauer

[11] Patent Number: 5,336,879
[45] Date of Patent: Aug. 9, 1994

[54] PIXEL ARRAY HAVING IMAGE FORMING PIXEL ELEMENTS INTEGRAL WITH PERIPHERAL CIRCUIT ELEMENTS

[75] Inventor: Donald J. Sauer, Allentown, N.J.

[73] Assignee: David Sarnoff Research Center, Inc., Princeton, N.J.

[21] Appl. No.: 68,340

[22] Filed: May 28, 1993

[51] Int. Cl.$^5$ ............................................. H01J 40/14
[52] U.S. Cl. .................... 250/208.1; 348/308
[58] Field of Search ................. 250/208.1; 257/444, 257/443; 358/213.22, 213.28, 213.29

[56] References Cited

U.S. PATENT DOCUMENTS

| | | | |
|---|---|---|---|
| 4,529,884 | 7/1985 | Wolicki | 250/370 |
| 4,905,265 | 2/1990 | Cox et al. | 250/370.09 |
| 5,023,455 | 6/1991 | Vanstraelen | 250/370.01 |
| 5,105,087 | 4/1992 | Jagielinski | 250/370.09 |
| 5,115,293 | 5/1992 | Murayama et al. | 357/30 |
| 5,182,625 | 1/1993 | Miyake et al. | 257/443 |
| 5,184,018 | 2/1993 | Conrads et al. | 250/370.09 |
| 5,196,721 | 3/1993 | Miyake et al. | 250/208.1 |
| 5,204,519 | 4/1993 | Nishihara et al. | 250/208.1 |

*Primary Examiner*—David C. Nelms
*Assistant Examiner*—K. Shami
*Attorney, Agent, or Firm*—William J. Burke

[57] ABSTRACT

In a pixel array having an array of pixel elements, a plurality of row select lines, a plurality of column select lines, and a plurality of signal lines, a pixel element is disclosed for minimizing dead space in an overall imager matrix which includes many pixel arrays. The pixel element includes a phototransducer device for detecting light, transmitting light or emitting light and a pair of series switching transistors coupled between the phototransducer device and a predetermined signal line. In addition, the pixel element includes at least one configurable transistor which is independent of the pair of switching transistors. This configurable transistor is interconnected with other configurable transistors from other pixel elements throughout the array in order to implement desirable functions, for example scanning circuitry, and amplification circuitry such that the dead space of each pixel array and, consequently, the overall imager array is minimized. Dead space around the periphery of the array is minimized allowing multiple arrays to abutted on all four sides to form a relatively large composite imaging array.

14 Claims, 9 Drawing Sheets

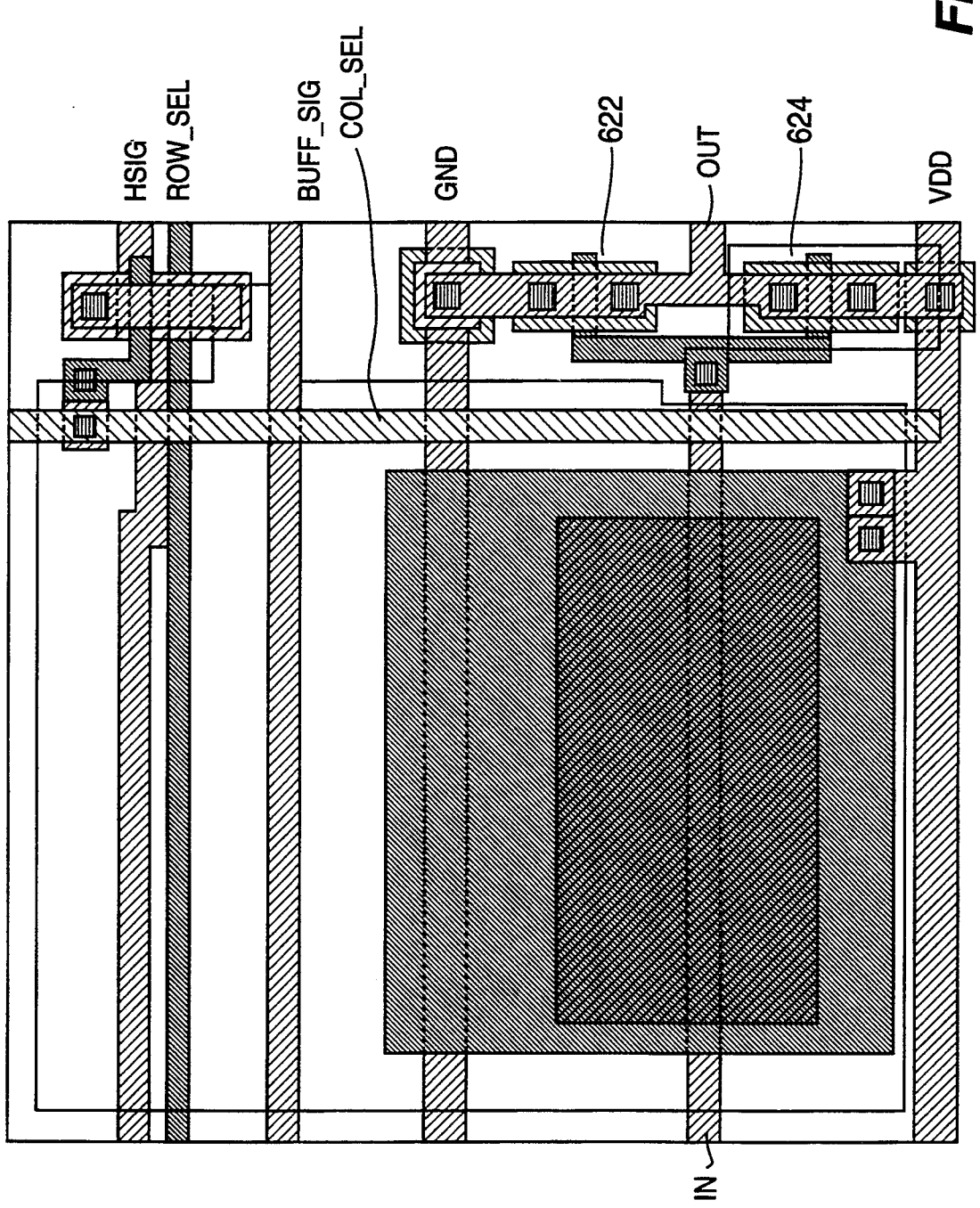

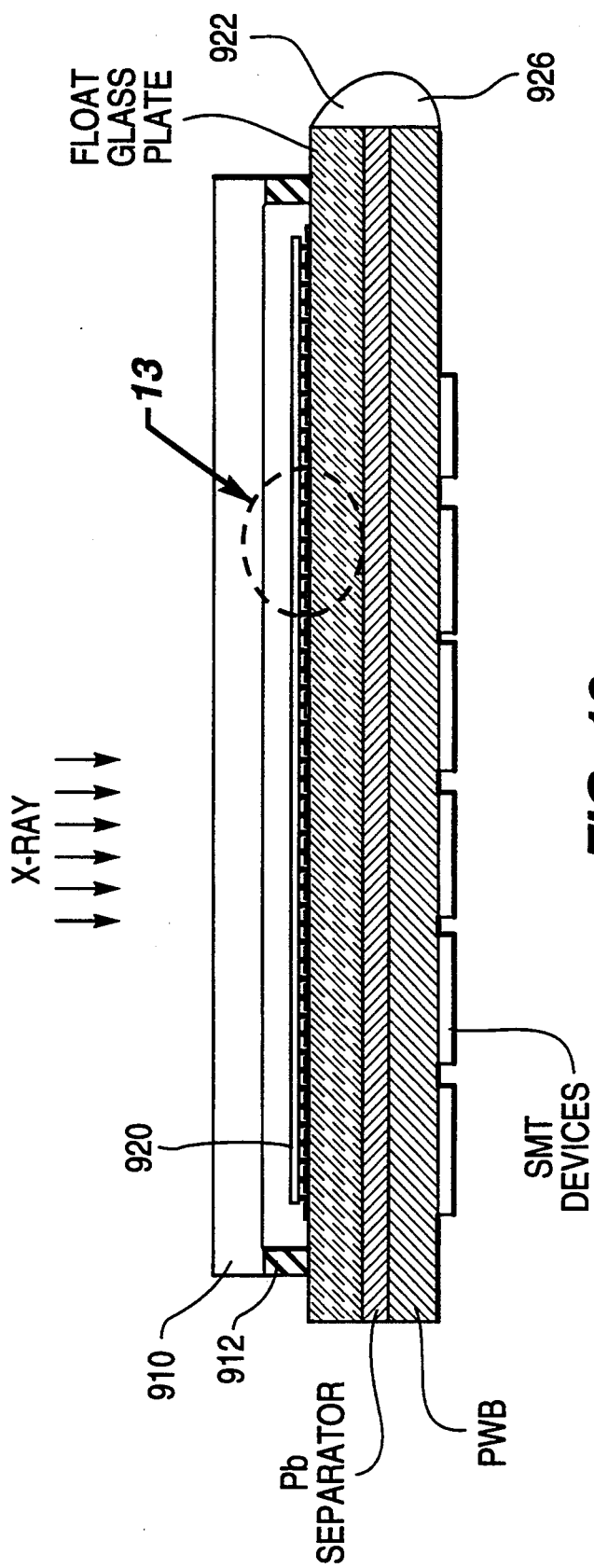
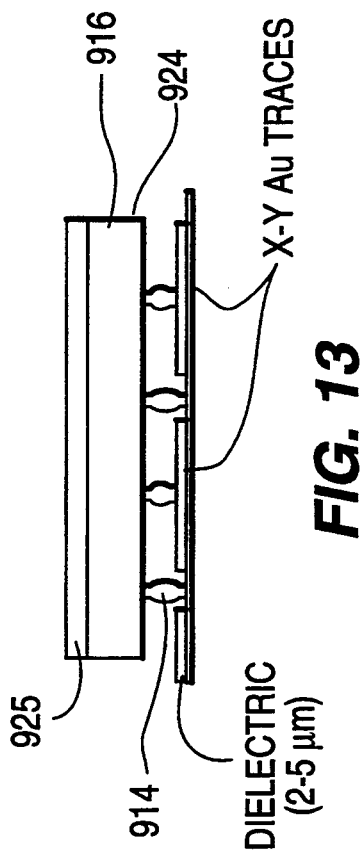

PIXEL ARRAY HAVING IMAGE FORMING PIXEL ELEMENTS INTEGRAL WITH PERIPHERAL CIRCUIT ELEMENTS

FIELD OF THE INVENTION

The invention relates generally to pixel arrays and, more particularly, it relates to imager or display pixel arrays having individual pixel elements which include extra configurable transistors that can be interconnected to form the circuitry necessary to implement peripheral functions such as amplifiers and switches.

BACKGROUND OF THE INVENTION

Current imaging devices such as Computer Automated Tomography (CAT) scanners typically use imager arrays in order to detect x-rays. A typical imager arrays generally consist of a matrix of picture element (pixel) sensors which employ photodetectors to detect the light emitted by a scintillation material, which has been excited by an x-ray, and a charge storage device (e.g., capacitor) to hold an amount of charge which depends on the intensity of the detected light.

In addition to the pixel elements in the imager arrays, other peripheral circuitry is typically used to access and read the charge held by individual capacitors. The other circuitry typically includes vertical and horizontal scanning circuits, amplifiers and switches. A major problem with this peripheral circuitry is that it consumes precious space on the imager arrays which could otherwise be used for light detection circuitry. The less light detection circuitry, the less accurate and precise are the detection readings. The space on the array which cannot detect light is known as dead space.

Examples of prior art imagers having dead space for the implementation of scanning circuitry include U.S. Pat. No. 5,184,018 (Conrads et al.) and U.S. Pat. No. 5,115,293 (Murayama et al.). Conrads discloses a light or x-ray sensitive sensor array in which each sensor has a photodetector in parallel with a storage capacitor which is serially connected with a switching FET. Conrads also discloses amplifiers, an analog multiplexer and a digital encoder all of which are separate from the sensor elements and implemented in the marginal area of the array. Murayama discloses an imaging device having a photodetector which is serially connected to two switching MOS transistors. Murayama also discloses a vertical scanning circuit and a horizontal scanning circuit separate from the pixel elements and implemented in the marginal area of the array.

In view of the disadvantages (e.g., increased size of the sensor) caused by dead space circuitry, it would be advantageous to have an imager array which provides, for example, amplifiers and scanning circuits but minimizes the amount of dead space on the array in order to maximize the accuracy and precision of the light detection readings. Substantially reduced dead space at the edges of an array also permit the arrays to be butted up against one another to form a larger array.

SUMMARY OF THE INVENTION

The invention is a pixel array which includes an array of image pixel elements, a plurality of select lines, and a plurality of signal lines. Each pixel element includes a phototransducer device which either senses light, modulates light or emits light. Each element further includes a switching device coupled between the phototransducer device and a predetermined signal line. The switching device responds to signals on a selected select line to convey signals between the phototransducer device and the predetermined signal line. Finally, the pixel element includes at least one configurable transistor, the configurable transistor being independent of the switching device. Within the pixel array, the individual configurable transistors of the various pixel elements are coupled together in order to implement circuits within the pixel array.

BRIEF DESCRIPTION OF THE DRAWING

The invention is best understood from the following detailed description when read in connection with the accompanying drawings, in which:

FIG. 8 shows a layout of the pixel element of FIG. 4 suitable for implementing an inverter function;

FIG. 12 is a side-view of the image sensor shown in FIG. 11 which is useful for describing a packaging scheme for the image sensor; and FIG. 13 is a detail view of the image sensor shown in FIG. 12 which is useful for describing a packaging scheme for the image sensor.

DETAILED DESCRIPTION OF THE INVENTION

The present invention has particular application for building both large imager or large display arrays by interconnecting many individual four-side buttable pixel arrays.

Figure 1:
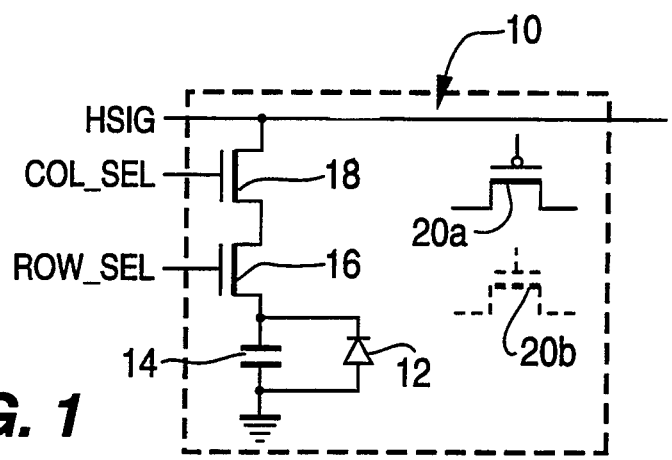
FIG. 1 shows a schematic representation of a single pixel element having at least one extra transistor.

FIG. 1 shows a schematic representation of a pixel element 10 suitable for use in a pixel array. The phototransducer device in the element 10 is a photodetector 12. Photodetector 12, such as a photodiode, is implemented using an N-well to P-substrate photodetector to integrate photo-generated charge. Photodetector 12 is coupled in parallel with a capacitor 14 to increase the maximum charge handling capacity of element 10. In the exemplary embodiment, capacitor 14 is a thin-oxide (Tox) capacitor.

Coupled between photodetector 12 and a signal line (HSIG) are two series connected transistors 16 and 18. Transistors 16 and 18 are responsive to the row select line (ROW_SEL) and column select line (COL_SEL), respectively, such that when both are activated the charge of element 10 is read out to HSIG. In the exemplary embodiment, transistors 16 and 18 are NMOS transistors.

In addition to, and independent of transistors 16 and 18, one or more "configurable" transistors 20a (with optional transistor 20b) may be included in element 10. The extra transistor(s), along with similar extra transistors within each of the remaining pixel elements in the pixel array, are "configured" with polysilicon and/or metallization interconnections as necessary to form the circuitry needed to implement desirable functions. These functions may be, for example, signal line source followers, analog switches, and row and column scanning registers. These transistors may be NMOS or PMOS or a mixture of the two types.

For those functions (such as low-noise source follower amplifiers) which are desirably implemented using relatively wide transistors, a number of the extra transistors from multiple pixel elements may be connected in parallel to form a composite device having the desired device size.

Because the peripheral functions are spread over many pixel elements on a pixel array, area at the edges of the pixel array is not needed to form the above-mentioned peripheral functions (e.g., scanning registers and sense amplifiers). In prior imager designs these elements are typically implemented along the edges of the imager array. This configuration allows the pixel array to have a very small dead space (i.e., space that is not sensitive to light photons) at the edges. Accordingly, multiple imager arrays may be joined along the edges to form larger arrays. Any distortion caused by the small gaps at the joined edges may be corrected using image processing techniques. The result is a 'seamless' overall imager array using multiple component fourside buttable pixel arrays. Since each component array is made separately, the manufacturing yield of a matrix of component arrays is typically much larger than for an equivalent monolithic array. Similar techniques may be used to form image display devices.

In a typical display device, the photodetector would be replaced, for example, by a liquid crystal device (LCD) or a light emitting device, such as a light-emitting diode (LED) or other electroluminescent device. When the phototransducers are LCD's, the active components of these arrays are typically thin film transistors (TFTs). In this instance, it may be desirable to implement the extra transistors as TFTs. In any image display device, it may be desirable to interconnect these transistors to form the desired peripheral circuits using a transparent conductor such as indium-tin oxide.

Figure 2:
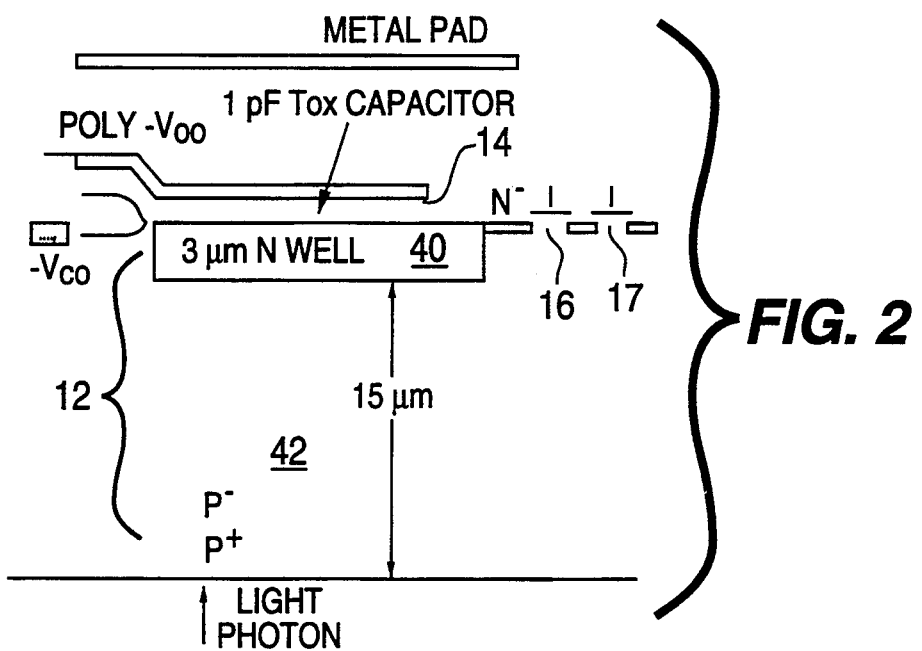
FIG. 2 is a side view of the pixel element of FIG. 1.
Figure 3:
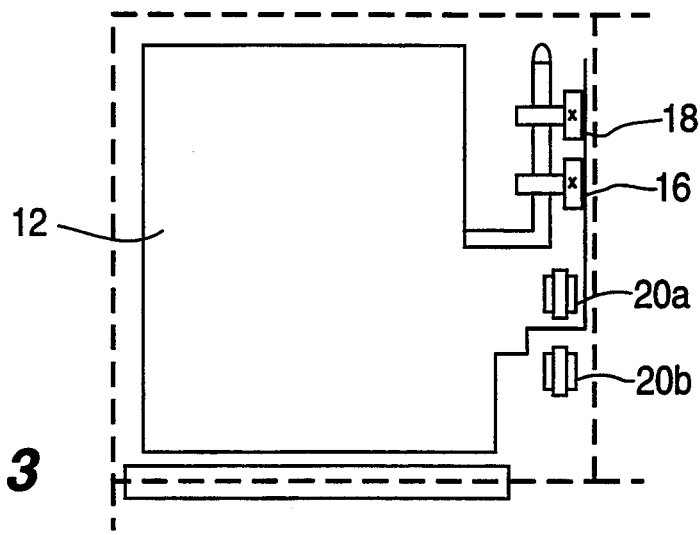
FIG. 3 is a top view of the pixel element of FIG. 1.

FIGS. 2 and 3 show layouts for the basic components of a pixel element as well as the extra transistor(s). FIG. 2 shows a side view of a layout of a basic pixel element without the extra transistor. In FIG. 2, photodetector 12 includes an N well 40 in a P substrate 42. A 1 picofarad (pF) Tox capacitor 14 is set in parallel with the layers of photodetector 12. Also, connected to N well 40 of photodetector 12, are the series transistors 16 and 18.

FIG. 3 shows a top view of a layout of the pixel element in FIG. 1. FIG. 3 shows the outline of photodetector 12 which is, in turn, coupled to series transistors 16 and 18. Two extra transistors 20a and 20b are also shown in FIG. 3.

Figure 4:
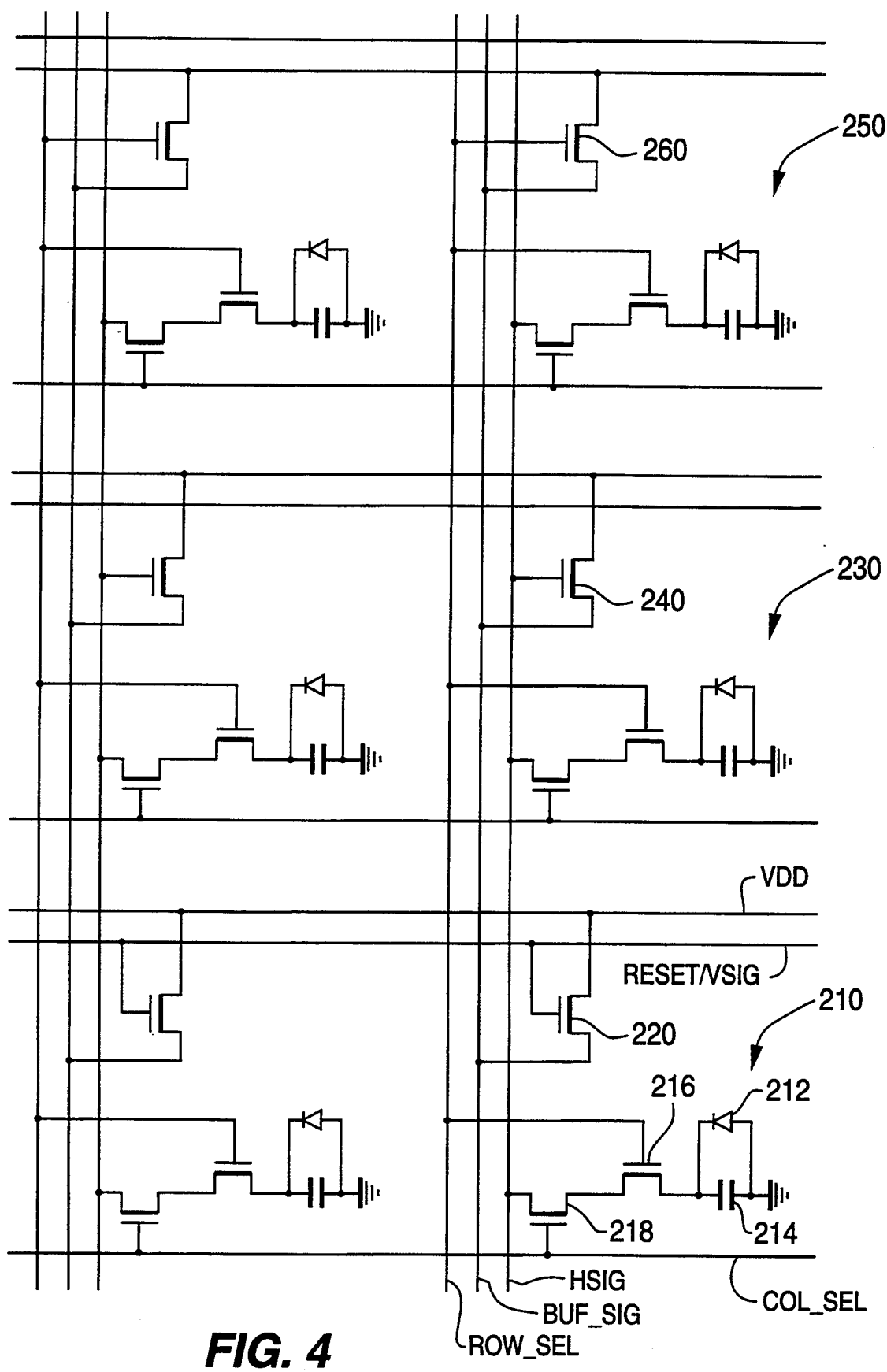
FIG. 4 shows a schematic representation of several pixel elements configured for different functions.

FIG. 4 shows a schematic representation of three pairs of pixel elements having their respective extra transistor configured for 3 different functions. For purposes of clarity, only one pixel element from each pair is described below. Pixel element 210 is configured to implement a reset function. Pixel element 230 is configured to implement an amplifier function. And, pixel element 250 is configured to implement an analog switch function.

As shown, element 210 includes photodetector 212 with parallel capacitor 214. Transistors 216 and 218 are coupled in series between photodetector 212 and the horizontal signal line (HSIG). The respective gates of transistors 216 and 218 are coupled to the ROW_SEL line and the COL_SEL line such that when both select lines are active the charge of element 210 (held by capacitor 214) is read out onto HSIG.

In general, the configuration of the photodetector, capacitor and the two switching transistors are the same for each pixel element; however, it is the configuration of the extra transistor 220, 240 or 260 which changes, thereby allowing peripheral circuitry to be implemented within the pixel arrays.

In element 210, to implement the reset function, the extra transistor 220 is coupled between a signal line which conveys a source of reference potential (e.g. VDD) and HSIG such that when the RESET/VSIG line is activated and the element 210 is selected, the element 210 is reset. This resetting of element 210 is accomplished by charging the capacitor 214 to VDD with respect to ground potential. During the imaging process, when the photodetector 212 is illuminated, it will reduce the level of charge on the capacitor 214, reducing the potential with respect to ground.

Figure 5:
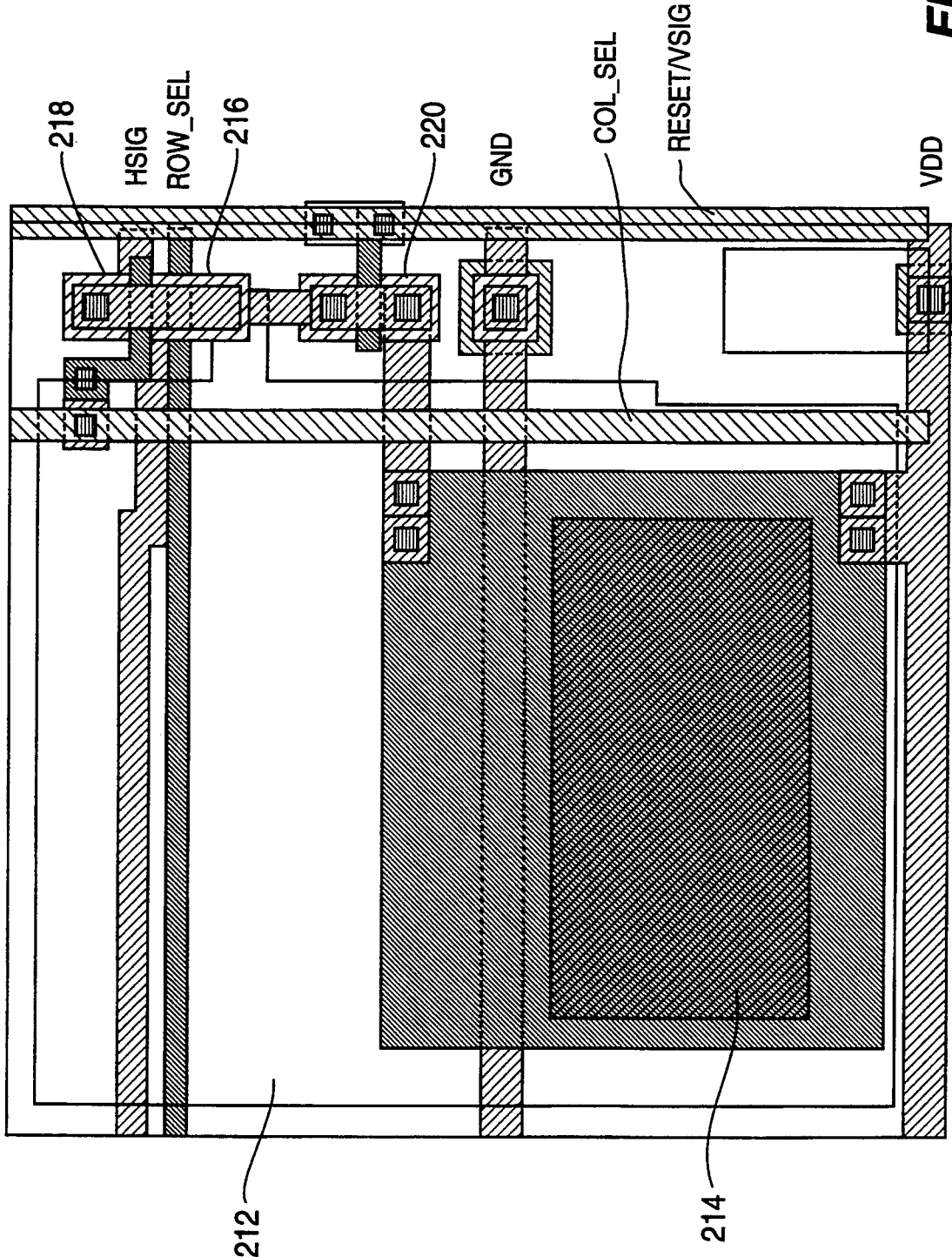
FIG. 5 shows a layout of a pixel element of FIG. 4 suitable for implementing a reset function.

A layout of element 210 suitable for use with the reset function is shown in FIG. 5. In FIG. 5, the outline of photodetector 212 includes a tab-like extension which connects with transistor 216. Transistor 216, in turn, is connected in series with transistor 218. As shown, the ROW_SEL and COL_SEL lines are connected to the gates of transistors 216 and 218 for controlling access to the state of photodetector 212 and capacitor 214 (i.e. the amount of electrical charge on the capacitor 214). The extra transistor 220 is connected between the VDD and HSIG signal lines with its gate connected to RESET/VSIG such that, when a positive pulse occurs on the RESET/VSIG line, and the transistors 216 and 218 are rendered conductive by the COL_SEL and ROW_SEL signals, the element 210 is reset.

Referring back to FIG. 4, the extra transistor 240 of pixel element 230 is configured to implement the amplifier function. Transistor 240 is coupled between the VDD and BUF_SIG signal lines and has the signal line HSIG is coupled to its gate electrode. Thus, when HSIG is active, it modulates the conductivity of transistor 240, which effectively places a buffered (i.e., amplified) version of the signal on the HSIG line onto the BUF_SIG line.

Figure 6:
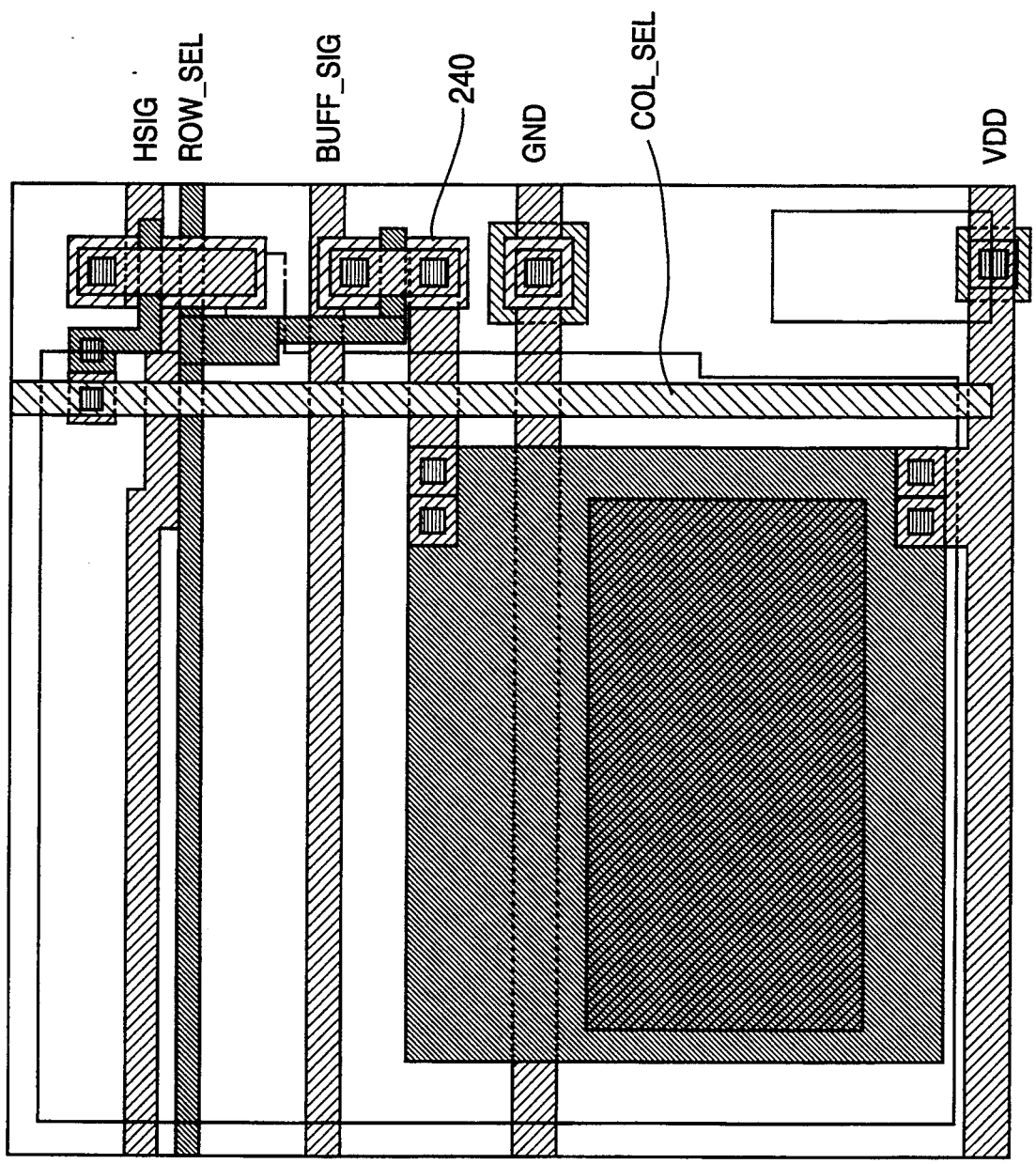
FIG. 6 shows a layout of a pixel element of FIG. 4 suitable for implementing an amplifier function.

In FIG. 6 a layout of element 230 suitable for implementing the amplifier function is shown in FIG. 6 is basically the same as that for element 210. The only significant difference is how extra transistor 240 is interconnected. In FIG. 6, the drain and source electrodes of transistor 240 are connected to the signal lines VDD and BUF_SIG, respectively, while its gate electrode is connected to the signal line HSIG. In this configuration, the signal on HSIG modulates the conductivity of transistor 240 which effectively causes it to act as an amplifier. In this instance, an amplified version of the signal on HSIG (i.e., a signal having the same characteristics as HSIG) is placed on the BUF_SIG line.

Referring back to FIG. 4, in element 250, transistor 260 is coupled between the signal lines RESET/VSIG and BUF_SIG to implement the analog switch function. In this configuration, when the ROW_SEL signal line is activated, the signal on the BUF_SIG signal line is gated onto the RESET/VSIG signal line.

Figure 7:
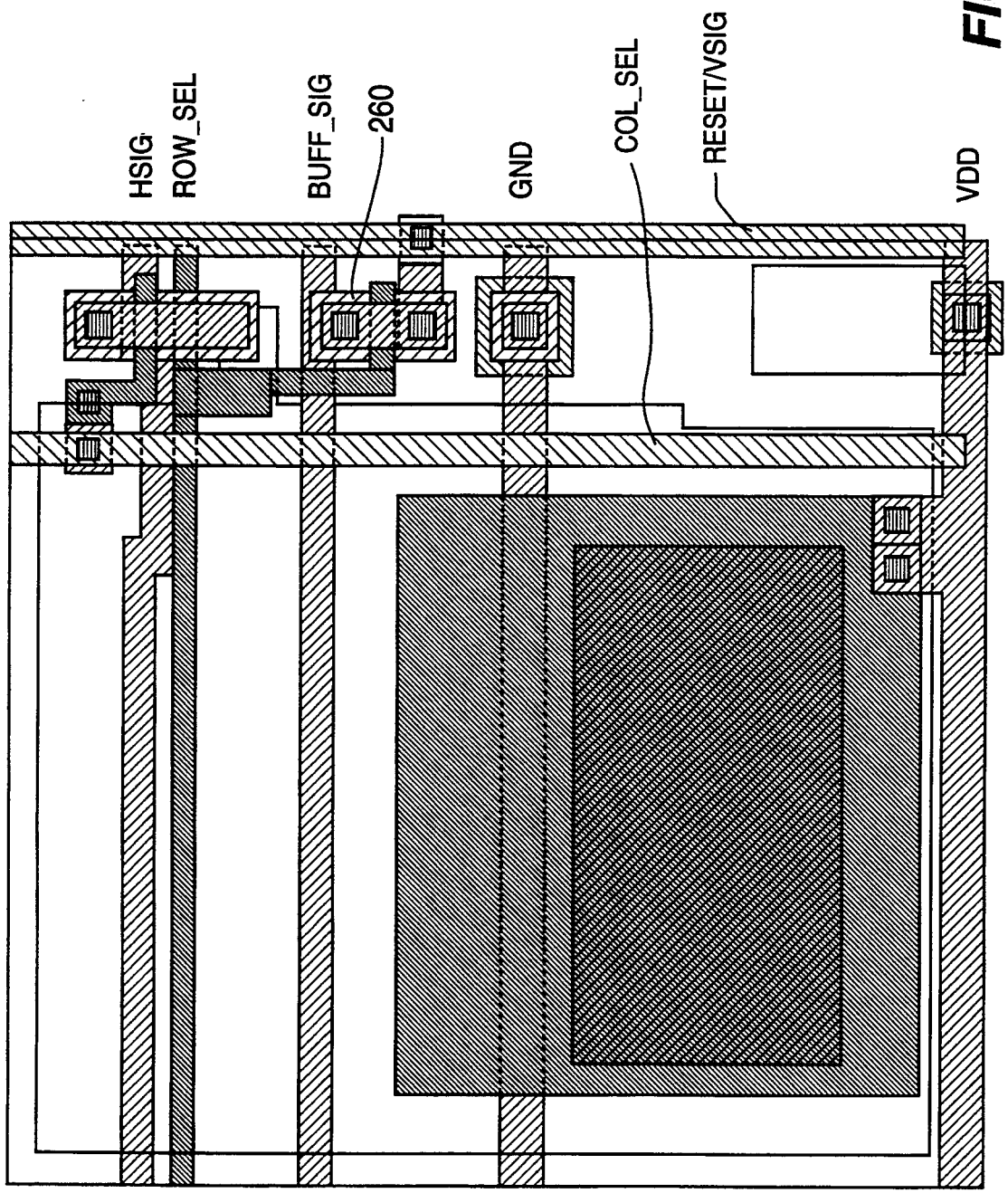
FIG. 7 shows a layout of a pixel element of FIG. 4 suitable for implementing an analog switch function.

In FIG. 7 a layout of element 250 suitable for use with the analog switch function is basically the same as that for pixel elements 210 and 230. Again, the only significant difference is how extra transistor 260 is interconnected. In FIG. 7 the source and drain electrodes of transistor 260 are connected between the BUF_SIG and RESET/VSIG signal lines and the gate electrode is connected to the ROW_SEL signal line. In this configuration, the signal on the ROW_SEL signal line turns on transistor 260 which effectively acts as a switch by routing the signal on the BUF_SIG line onto the RESET/VSIG line from which it can then be read.

In addition to the above configurations of the extra transistors, it is also desirable to be able to implement an inverter device available, for example, to simplify the implementation of scanning circuits. In FIG. 8 a pixel element 610 includes extra transistors 622 and 624 coupled to implement a CMOS inverter circuit. In this circuit, an input signal applied to the IN line produces an inverted version of the signal on the OUT line.

Figures 9, 10:
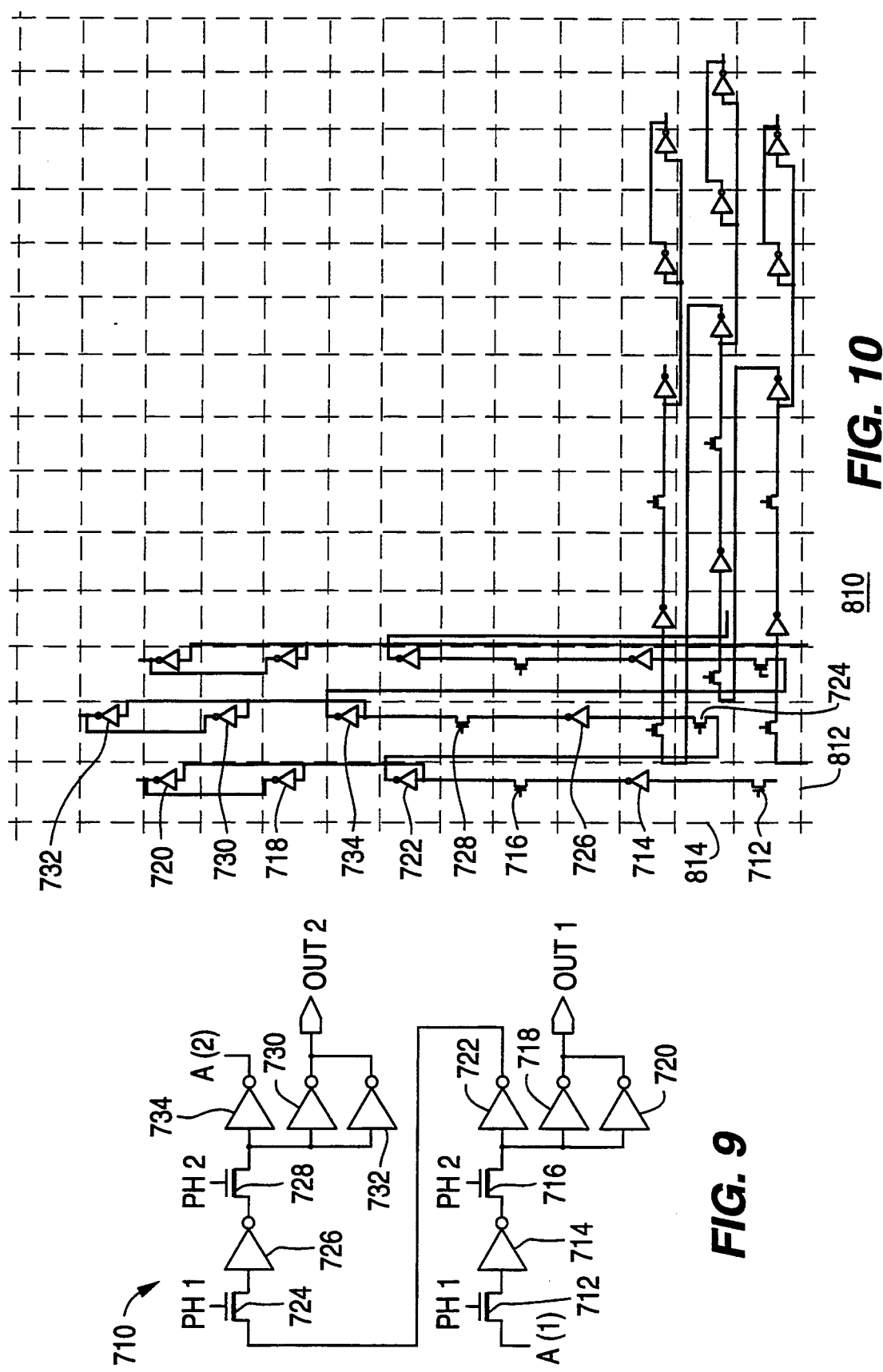
FIG. 9 shows a schematic representation of a basic shift register element comprising a plurality of extra transistors from pixel elements such as that shown in FIG. 1.
FIG. 10 shows a schematic representation of a partial interconnection layout of several shift register elements such as those shown in FIG. 9.

In FIG. 9 a basic shift register element 710 used to implement a read out scheme has a positive potential (i.e. logic-high) at input terminal A(1) which is propagated through the transistor 712 responsive to a pulse of the clock signal PH1. An electrical charge caused by gating the potential is stored on the capacitance of the gate electrodes of the transistors which make-up the inverter circuit 714. The source of this capacitance is described below with reference to FIG. 10.

The positive potential (logic-high) at the input terminal of the inverter causes the inverter to gate its output terminal to a source of reference potential (e.g. ground) Next, in response to a pulse of a clock signal PH2, any charge stored at the input terminals of the inverters 718, 720 and 722 is drained to ground (i.e. logic-low), causing the output terminals of the inverters to become logic-high.

At the end of the pulse applied to A(1), when the input signal becomes logic-low, a pulse of the clock signal PH1 brings the input terminal of the inverter 714 logic-low, causing it to provide a logic-high signal to the input terminals of the inverters 718, 720 and 722, responsive to a pulse of the clock signal PH2. This logic-high input signal becomes a logic-low signal at the output terminals of the inverters 718, 720 and 722. The output signal of the inverter 722 propagates through the circuitry which includes the transistors 724 and 728 and the inverter circuits 726, 730, 732 and 734 in the same manner as described above with respect to the corresponding transistors 712 and 716 and inverter circuits 714, 718, 720 and 722.

A scan register for one or both of the rows and columns of the pixel array is implemented by connecting a plurality of circuits 710 in series with the A(2) output of one circuit coupled to the A(1) input of the next circuit. The drive lines for the respective rows or columns are the output lines OUT1 and OUT2.

In circuit 710, the inverters 718 and 719 are coupled in parallel to provide sufficient current to drive a row or column line of the display device. The exemplary clock signals PH1 and PH2 are two mutually exclusive phases of a single multi-phase clock signal. The frequency of this signal is desirably much greater than the scanning frequency of the pixel array.

In FIG. 10 a partial layout of several interconnected shift register elements includes only a portion of a row-scan shift register and a corresponding portion of a column-scan shift register are shown. The circuit elements 712 through 734 implement the same circuit as the corresponding elements of FIG. 9. In FIG. 10, each circuit element is implemented in a respectively different imaging cell of the matrix 810 as indicated by the broken lines. For example transistor 712 is implemented in imaging cell 812 while inverter 714 is implemented in cell 814.

It is noted that the input signal lines to the inverters, for example inverter 714 are relatively long. The capacitance of these lines augments the input capacitance to the inverters, allowing electrical charge to be stored on the input terminals of the respective inverters in the time between the clock phase PH1 and PH2.

The invention is an imaging device comprising a plurality of pixel arrays with means for coupling multiple ones of the pixel arrays to form the imaging device. The arrays comprise a plurality of configurable pixel elements for minimizing space in the array which is not occupied by pixel elements, each of the plurality of configurable pixel elements comprising phototransducer means, switching means coupled between the phototransducer means and one of the plurality of signal lines; wherein the switching means is responsive to signals on one of the plurality of select lines for conveying signals between the phototransducer and the one signal line, at least one configurable transistor, the configurable transistor being independent of the switching means, and means for coupling a plurality of configurable transistors on a respective plurality of pixel elements to form the peripheral circuitry within the array of pixel elements. The configurable pixel elements comprise photodetector means for detecting light and for holding a charge associated with the detection, select means for conveying a signal related to a held charge from a pixel element to circuits external to the imaging array, means, coupled to the photodetector means and responsive to the select means, for allowing access to a held charge, at least one configurable transistor independent of the select means, and means for coupling the configurable transistor to a plurality of other configurable transistors from the other ones of the configurable pixel elements in order to form peripheral circuitry within the imaging array.

Figure 11:
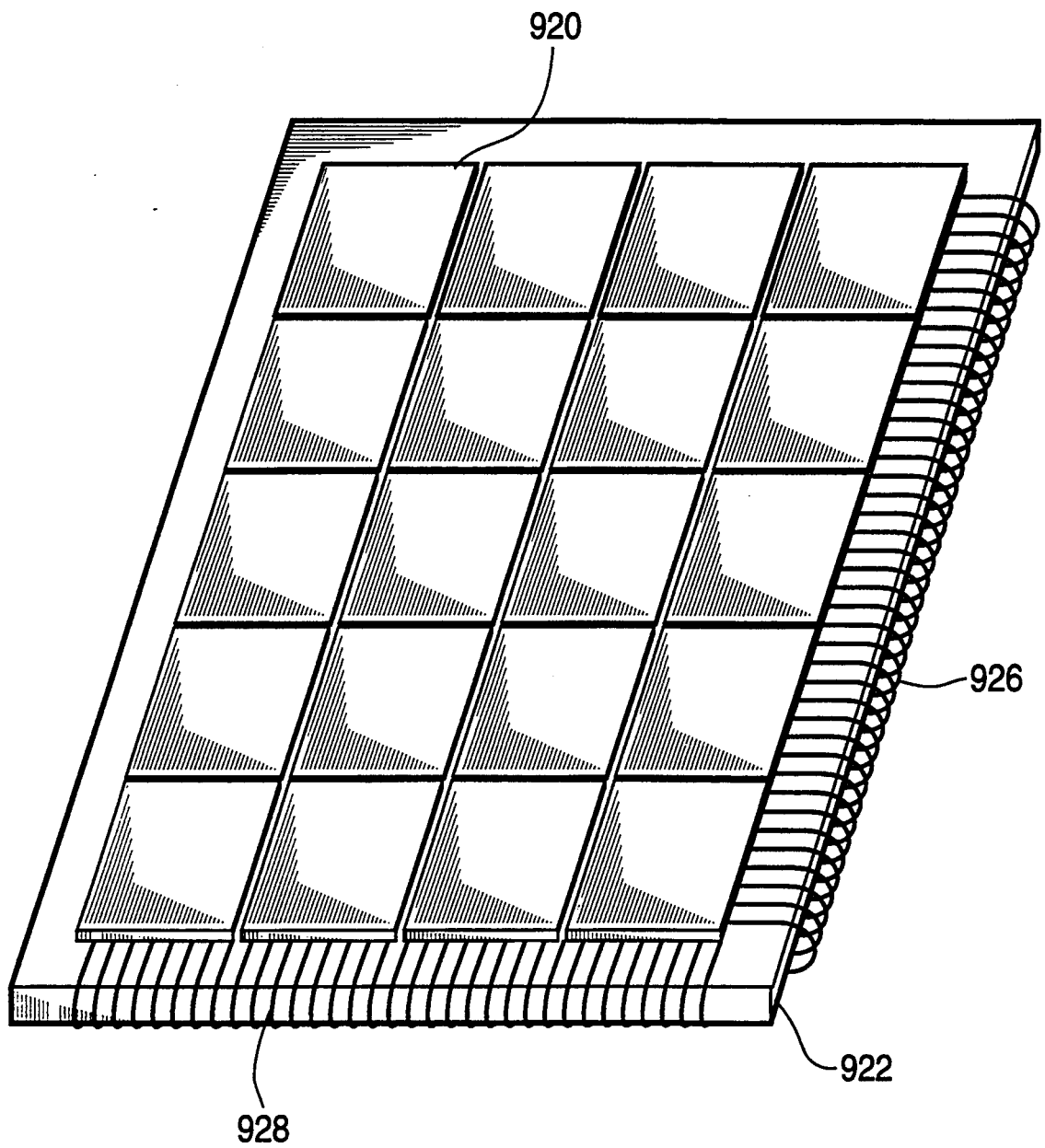
FIG. 11 shows an image sensor formed as a matrix of 20 imager arrays each formed from pixel cells such as that shown in FIG. 1.

FIGS. 11, 12 and 13 show a packaging scheme for an imager array including multiple four-side buttable pixel arrays. In FIG. 11, 20 (4×5) pixel arrays 920 are shown mounted on a glass plate 922. The pixel arrays are interconnected with X and Y traces 926 and 928 set out on the glass plate 922. FIG. 12 shows a side view of multiple pixel arrays mounted on glass plate 920 and being hermetically sealed. FIG. 13 shows an enlarged section of FIG. 12 particularly detailing the X and Y traces, 926 and 928, which include solder bumps for connecting to the pixel array modules. Also shown is the insulating dielectric 924 which separates the horizontally-oriented X traces 926 from the vertically-oriented Y traces 928.

In FIG. 13, the pixel arrays consist of silicon wafers 924 epoxied to a glass substrate 925 (preferably, phosphor-coated glass substrates). Prior to securing the silicon wafer containing the pixel elements to the glass substrate, however, the silicon wafer is thinned from the backside to approximately 15 um near the P+ to P− boundary. It should be noted that back-side implanting should not be necessary to control the backside surface recombination velocity. The 550 nm wavelength should provide adequate quantum efficiency.

The thinned silicon wafers 924 are then epoxied to the glass substrate 925. After cutting the glass substrate into tiles, the tiles are flipped and indium bump bonded to a printed circuit carrier. The backside of the original silicon wafer 924 bonded to the glass plate 925 is now the top surface of the printed circuit carrier and acts as the imaging side of the device. This is illustrated in FIGS. 12 and 13.

In the present invention, each pixel array (or tile) is implemented using a CMOS single-polysilicon gate, double-level metal process. One of ordinary skill in the art of fabricating semiconductor imaging arrays would recognize this as a standard foundry process. A $P^-$ type epitaxial layer having a thickness of approximately 15 um on a $P^+$ type substrate is used. A tile may include approximately $250 \times 250$ pixels depending on the yield with each pixel element being approximately 85 um $\times$ 85 um.

Additionally, each tile is four-side buttable with a gap of less than 20 um at the butt edge. As mentioned, the pixel elements extend to the edge of the tile with the scan registers, signal amplifiers and multiplexers built using the extra configurable devices. The edge of each tile is sealed using a $P^+$ and metal contact to the $P^-$ substrate in order to avoid any unpassivated junctions along the edge of the tile.

Some device design criteria for a pixel array are as follows:

---
Signal Line Capacitance Components
1. $N^+$ to $P^-$ substrate ($V_{pn} = -3V$)
   $Ca = 0.31$ fF/$\mu m^2$ @ 0V
   $Ca = 0.16$ fF/$\mu m^2$ @ $-3V$ Area = 16 $\mu m^2$ $Ca = 2.6$ fF
   $Cp = 0.2$ fF/$\mu m$ @ 0V
      $Cp = 0.77$ fF/$\mu m$ @ $-3V$ Per = 12 $\mu m$ $Cp = 2.0$ fF
      $mj = 0.5$ $msj = 0.1$
2. Cgd overlap for Q2 drain
   (Col_Select NMOS Device)
   $Cp = 0.25$ fF/$\mu m$ Per = 4.0 $\mu m$ $Cp = 1.0$ fF
3. Poly to Field
   $Wpoly = 2$ $\mu m$
   $Ca = .06$ fF/$\mu m^2$ Area = 40 $\mu m^2$ $Ca = 2.4$ fF
   $Cp = .05$ fF/$\mu m$ Per = 40 $\mu m$ $Cp = 2.0$ fF
4. Metal1 to Field
   $Wm1 = 3.0$ $\mu m$
   $Ca = .04$ fF/$\mu m^2$ Area = 260 $\mu m^2$ $Ca = 10.4$ fF
   $Cp = .048$ fF/$\mu m$ Per = 170 $\mu m$ $Cp = 8.2$ fF
5. Metal1 to Metal2
   $Wm2 = 3.0$ $\mu m$
   $Ca = .035$ fF/$\mu m^2$ Area = 9.0 $\mu m^2$ $Ca = 0.3$ fF
   $Cp = .048$ fF/$\mu m$ Per = 12.0 $\mu m$ $Cp = 0.6$ fF
   Total Signal Line Cap/pixel  C/pixel = 29.5 fF
   Total Cl for 50 pixel line:  Cl = 1.5 pF
6. Signal_Line source follower gate input capacitance.
   $Cg = 1.0$ fF/$\mu m^2$ ($Cox = 350A$)
   Cgd overlap = 0.25 fF/$\mu m$
   $W = 200$ $\mu m$ $L = 1.0$ $\mu m$ $Av = 0.85$
   $Cin = 200$ $\mu m \times 2.0$ $\mu m \times [(1-Av) \times 0.67 + 0.33] \times 1.0$ fF/$\mu m^2$
      $+$
      $200$ $\mu m \times 0.25$ fF/$\mu m$ = 0.22 pF
TOTAL Signal_Line Capacitance $Ctot = Cl + Cin$
   $Ctot = 1.5$ pF + 0.22 pF = 1.72 pF
Dynamic Range Components
Pixel Voltage Swing for 40M e-signal, photodetector $Cpx = 1.5$ pF
   $dVpx = Qpx/Cpx = 4.3$ V
Output Signal_Line Voltage
   $dVsig = Qpx/(Cpx + Ctot) = 2.0V$
Pixel kTC Noise Limit
   $Vnpx = 400 \div 1.5 = 490e$- rms @ 25C
Source Follower Noise Estimate ($W = 200$ $\mu m$, $L = 2$ $\mu m$, $Ids = 2mA$, $BW = 5MHz$)

$Vnt = 3nV/\sqrt{Hz}$ (transistor equivalent input noise level)
$Vn = 6.7$ $\mu V$
$Qn = 2.16E - 17C = 135e-$
Total RMS Readout Noise Level
   $Qntot = 508e-$
Linear Dynamic Range (Peak Signal to RMS Noise)
   $S/N = 40Me-/508e- = 78,740$ (98 db)

---

The invention is also an imaging device comprising a imager array of the invention with an associated means for generating light when excited by electromagnetic radiation of a different wavelength such as x-rays or gamma rays, such as a scintillation material. The scintillation material preferably overlies a surface of the imaging array in close proximity to the photodetectors of the pixel arrays. The scintillation material may be a uniform body of material or subdivided corresponding in size to the pixel arrays which make up the imager array or smaller dimensions to reduce the spreading of the scintillation radiation and improve imager resolution. A suitable scintillation material for detecting x-rays is gadolinium oxysulphide: europium, gadolinium oxide: europium and lanthanum oxide bromide; terbium. The output wavelength of the scintillation material is preferably matched to the detector sensitivity.

It should be noted that although the present invention is described in an imager pixel array application, the present invention can also be used in a display pixel array application. Display arrays experience the same problems as do imager arrays in that circuitry is needed to access the pixel elements which, rather than detecting light, modulate or emit light in order to produce an overall large display picture. Thus, the present invention is useful in conjunction with any type of phototransducer element which either detects or transmits light which has application in an array device.

Although the invention is illustrated and described herein embodied as an imager pixel array in which each pixel element typically includes at least one extra configurable device, the invention is nevertheless not intended to be limited to the details as shown. For example, it is not necessary that there be an extra configurable device at each pixel element. Rather, various modifications may be made in the details within the scope and range of equivalents of the claims and without departing from the spirit of the invention.

The invention claimed is:

1. A pixel array comprising:
   a plurality of select lines;
   a plurality of signal lines;
   an array of pixel elements, a pixel element including:
   phototransducer means;
   switching means coupled between the phototransducer means and one of the plurality of signal lines; wherein the switching means is responsive to signals on one of the plurality of select lines for conveying signals between the phototransducer and the one signal line;
   at least one configurable transistor in each of a plurality of pixel elements, the configurable transistor being independent of the switching means; and
   means for coupling a plurality of configurable transistors on a respective plurality of pixel elements to implement peripheral circuitry within the array of pixel elements.

2. The pixel array of claim 1, wherein:

the plurality of select lines includes a plurality of column select lines;
the switching means includes two series transistors respectively responsive to a selected column select line; and
means for coupling the plurality of configurable transistors implements a column select shift register.

3. The pixel array of claim 2, wherein the phototransducer means is a photodetector.

4. In a pixel array having an array of pixel elements, a plurality of select lines, and a plurality of signal lines, the improvement comprising a pixel element for minimizing dead space comprising:
phototransducer means;
switching means coupled between the phototransducer means and one of the plurality of signal lines; wherein the switching means is responsive to signals on one of the plurality of select lines for conveying signals between the phototransducer means and the one signal line;
at least one configurable transistor, the configurable transistor being independent of the switching means; and
means for coupling the configurable transistor to selected ones of the plurality of select lines and the signal lines to implement a peripheral circuit within the array of pixel elements.

5. The pixel array of claims 4 wherein the phototransducer means is a photodetector.

6. The pixel array of claim 5 further comprising a charge storage means coupled in parallel with the photodetector for holding an electrical charge having a magnitude which is determined by light intensity.

7. In a pixel array having an array of pixel elements, a plurality of row select lines, a plurality of column select lines, a plurality of signal lines, and a plurality of auxiliary lines, the improvement comprising one or more pixel elements for minimizing dead space, each comprising:
a phototransducer means;
switching means coupled between the phototransducer means and a predetermined signal line; wherein the switching means is responsive to signals on a selected one of the row select lines and on a selected one of the column select lines for conveying signals between the phototransducer means and the predetermined signal line;
at least one configurable transistor, the configurable transistor being independent of the switching means; and
means for coupling the configurable transistor to selected ones of the plurality of auxiliary lines and, selected ones of the plurality of signal lines in order to implement a peripheral circuit within the pixel element.

8. The pixel element of claim 7, wherein
the configurable transistor is coupled between the predetermined signal line and a source of reference potential;
the plurality of auxiliary lines includes a reset line;
the configurable transistor is responsive to the reset line such that when the reset line and the selected row and column select lines are asserted, the pixel element is subjected to the reference potential and is reset.

9. The pixel element of claim 7 wherein the plurality of auxiliary lines includes a buffered signal line, wherein the configurable transistor is coupled between the buffered signal line and a source of reference potential, wherein the configurable transistor is responsive to the predetermined signal line such that when the predetermined signal line is asserted, the buffered signal line carries an amplified version of the predetermined signal line.

10. The pixel element of claim 7 wherein the plurality of signal lines includes a first plurality of signal lines and a second plurality of signal lines, wherein the configurable transistor is coupled between one of the first plurality of signal lines and one of the second plurality, wherein the configurable transistor is responsive to the selected row select line such that when the selected row select line is asserted, the configurable transistor couples the one of the first plurality of signal lines to the one of the second plurality of signal lines.

11. In a pixel array having an array of pixel elements for detecting light and holding a charge associated with the detected charge, and select means for gating a signal related to a held charge from a pixel element to circuits external to the array, the improvement comprising a one or more configurable pixel elements for minimizing dead space, each of the configurable pixel elements comprising:
a phototransducer means;
means for holding a charge associated with the detected light;
means, coupled to the means for holding the charge and responsive to the select means, for allowing access to a held charge;
at least one configurable transistor independent of the select means; and
means for coupling the configurable transistor to a plurality of other configurable transistors from other ones of the configurable pixel elements in order to form peripheral circuitry within the array of pixel elements.

12. A device including a matrix of pixel arrays, each of said arrays comprising:
means for coupling multiple ones of said arrays to form said device;
a one or more configurable pixel elements for minimizing space in the array which is not occupied by pixel elements, each of the configurable pixel elements comprising:
phototransducer means;
switching means coupled between the phototransducer means and one of the plurality of signal lines; wherein the switching means is responsive to signals on one of the plurality of select lines for conveying signals between the phototransducer and the one signal line;
at least one configurable transistor, the configurable transistor being independent of the switching means; and
means for coupling a plurality of configurable transistors on a respective plurality of pixel elements to implement peripheral circuitry within the array of pixel elements.

13. The device of claim 12 wherein the arrays are pixel imaging arrays, each of said imaging arrays comprising a plurality of configurable pixel elements comprising:
photodetector means for detecting light and for holding a charge associated with the detection;
select means for conveying a signal related to a held charge from a pixel element to circuits external to the imaging array;

means, coupled to the photodetector means and responsive to the select means, for allowing access to a held charge;

at least one configurable transistor independent of the select means; and means for coupling the configurable transistor to a plurality of other configurable transistors from other ones of the configurable pixel elements in order to peripheral circuitry within the imaging array.

14. In an imaging array comprising means for generating light of a particular wavelength in response to radiation of a different wavelength and one or more photodetector arrays, wherein the means for generating light is positioned in proximity to a photodetector array, the improvement comprising a photodetector array comprising:

a plurality of select lines;

a plurality of signal lines;

an array of pixel elements, each pixel element including:

photodetector means for detecting light at the particular wavelength;

switching means coupled between the photodetector means and one of the plurality of signal lines; wherein the switching means is responsive to signals on one of the plurality of select lines for conveying signals between the photodetector and the one signal line;

at least one configurable transistor in each of a plurality of pixel elements, the configurable transistor being independent of the switching means; and means for coupling a plurality of configurable transistors on a respective plurality of pixel elements to implement peripheral circuitry within the photodetector array of pixel elements.

* * * * *

(12) EX PARTE REEXAMINATION CERTIFICATE (5446th)
United States Patent
Sauer

(10) Number: US 5,336,879 C1
(45) Certificate Issued: Jul. 11, 2006

(54) PIXEL ARRAY HAVING IMAGE FORMING PIXEL ELEMENTS INTEGRAL WITH PERIPHERAL CIRCUIT ELEMENTS

(75) Inventor: Donald J. Sauer, Allentown, NJ (US)

(73) Assignee: Sarnoff Corporation, Princeton, NJ (US)

Reexamination Request:
No. 90/006,003, May 11, 2001

Reexamination Certificate for:
Patent No.: 5,336,879
Issued: Aug. 9, 1994
Appl. No.: 08/068,340
Filed: May 28, 1993

(51) Int. Cl.
*H01J 40/14* (2006.01)

(52) U.S. Cl. .................... 250/208.1; 348/308
(58) Field of Classification Search .......... 250/208.1, 250/214.1; 348/308; 257/443, 444
See application file for complete search history.

(56) References Cited

U.S. PATENT DOCUMENTS

| | | | |
|---|---|---|---|
| 4,407,010 A | 9/1983 | Baji et al. | 358/213 |
| 4,800,288 A | 1/1989 | Inagaki et al. | 250/578 |
| 4,954,895 A | 9/1990 | Akimoto et al. | 358/231.11 |
| 4,994,877 A | 2/1991 | Ino et al. | 357/30 |
| 5,220,170 A | 6/1993 | Cox et al. | 250/370.09 |
| 5,288,993 A | 2/1994 | Bidiville et al. | 250/221 |

OTHER PUBLICATIONS

International Search Report by European Patent Office for PCT/US94/05801.

*Primary Examiner*—Stephone B. Allen

(57) ABSTRACT

In a pixel array having an array of pixel elements, a plurality of row select lines, a plurality of column select lines, and a plurality of signal lines, a pixel element is disclosed for minimizing dead space in an overall imager matrix which includes many pixel arrays. The pixel element includes a phototransducer device for detecting light, transmitting light or emitting light and a pair of series switching transistors coupled between the phototransducer device and a predetermined signal line. In addition, the pixel element includes at least one configurable transistor which is independent of the pair of switching transistors. This configurable transistor is interconnected with other configurable transistors from other pixel elements throughout the array in order to implement desirable functions, for example scanning circuitry, and amplification circuitry such that the dead space of each pixel array and, consequently, the overall imager array is minimized. Dead space around the periphery of the array is minimized allowing multiple arrays to abutted on all four sides to form a relatively large composite imaging array.

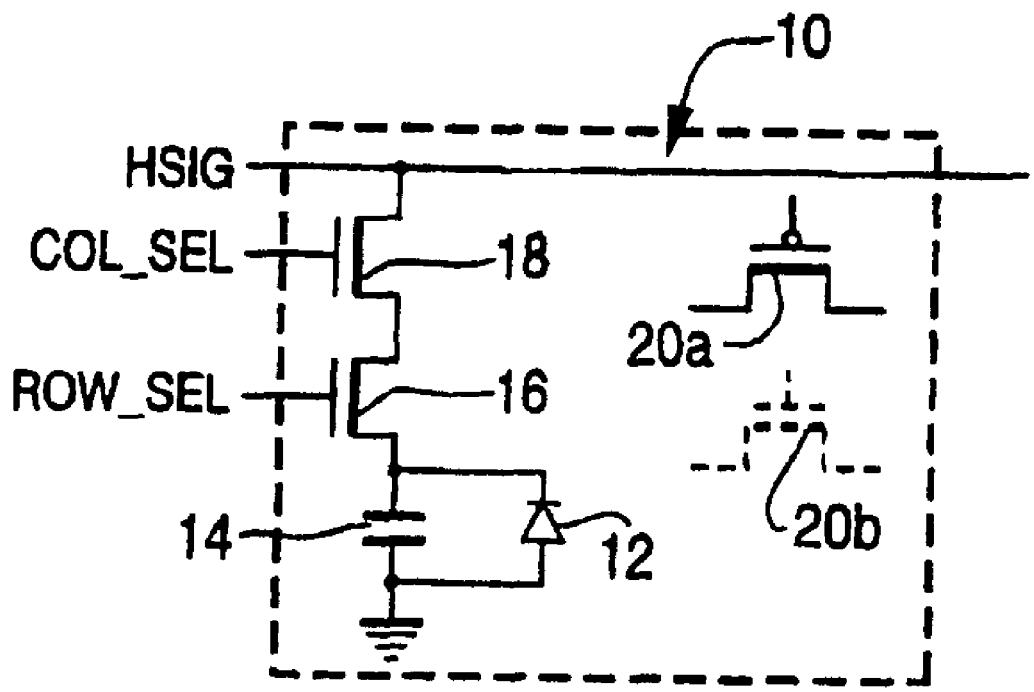

US 5,336,879 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 11–13 is confirmed.

Claims 7 and 8 are cancelled.

Claims 1, 2, 4, 9, 10 and 14 are determined to be patentable as amended.

Claims 3, 5 and 6, dependent on an amended claim, are determined to be patentable.

1. A pixel array comprising:
a plurality of select lines;
a plurality of signal lines;
an array of pixel elements, a pixel element including:
   phototransducer means;
   switching means coupled between the phototransducer means and one of the plurality of signal lines; wherein the switching means is responsive to signals on one of the plurality of select lines for conveying signals between the phototransducer and the one signal line;
   at least one configurable transistor in each of a plurality of pixel elements, [the] *each* configurable transistor *having a plurality of terminals adapted to establish connections among ones of the configurable transistors, the configurable transistors* being independent of the switching means; and
   [means for coupling a plurality of configurable transistors on a respective plurality of pixel elements to implement peripheral circuitry within the array of pixel elements.]
   *a plurality of connection devices which connect selected ones of the terminals of the configurable transistors to form an arbitrary multi-transistor circuit which is distributed across a plurality of the pixel elements in the pixel array.*

2. [The pixel array of claim 1,] *A pixel array comprising:*
*a plurality of select lines;*
*a plurality of signal lines;*
*an array of pixel elements, a pixel element including:*
   *phototransducer means;*
   *switching means coupled between the phototransducer means and one of the plurality of signal lines; wherein the switching means is responsive to signals on one of the plurality of select lines for conveying signals between the phototransducer and the one signal line;*
   *at least one configurable transistor in each of a plurality of pixel elements, the configurable transitor being independent of the switching means; and*
   *means for coupling a plurality of configurable transistors on a respective plurality of pixel elements to implement peripheral circuitry within the array of pixel elements,*
wherein:
   the plurality of select lines includes a plurality of column select lines;
   the switching means includes two series transistors respectively responsive to a selected column select line; and
   means for coupling the plurality of configurable transistors implements a column select shift register.

4. In a pixel array having an array of pixel elements, a plurality of select lines, and a plurality of signal lines, the improvement comprising a pixel element for minimizing dead space comprising:
   phototransducer means;
   switching means coupled between the phototransducer means and one of the plurality of signal lines; wherein the switching means is responsive to signals on one of the plurality of select lines for conveying signals between the phototransducer means and the one signal line;
   at least one configurable transistor *in at least one pixel,* the configurable transistor being independent of the switching means[;] and *having a plurality of terminals adapted to establish connections outside said at least one pixel, the configurable transistors being independent of the switching means; and*
   means for coupling the configurable transistor to selected ones of the plurality of select lines and the signal lines to implement a peripheral circuit *in a plurality of pixels* within the array of pixel elements.

9. [The pixel element of claim 7] *In a pixel array having an array of pixel elements, a plurality of row select lines, a plurality of column select lines, a plurality of signal lines, and a plurality of auxiliary lines, the improvement comprising one or more pixel elements for minimizing dead space, each comprising:*
   *a phototransducer means;*
   *switching means coupled between the phototransducer means and a predetermined signal line; wherein the switching means is responsive to signals on a selected one of the row select lines and on a selected one of the column select lines for conveying signals between the phototransducer means and the predetermined signal line;*
   *at least one configurable transistor, the configurable transistor being independent of the switching means; and*
   *means for coupling the configurable transistor to selected ones of the plurality of auxiliary lines and, selected ones of the plurality of signal lines in order to implement a peripheral circuit within the pixel element;*
wherein the plurality of auxiliary lines includes a buffered signal line, wherein the configurable transistor is coupled between the buffered signal line and a source of reference potential, *and* wherein the configurable transistor is responsive to the predetermined signal line such that when the predetermined signal line is asserted, the buffered signal line carries an amplified version of the predetermined signal line.

10. [The pixel element of claim 7] *In a pixel array having an array of pixel elements, a plurality of row select lines, a plurality of column select lines, a plurality of signal lines, and a plurality of auxiliary lines, the improvement comprising one or more pixel elements for minimizing dead space, each comprising:* a phototransducer means;

switching means coupled between the phototransducer means and a predetermined signal line; wherein the switching means is responsive to signals on a selected one of the row select lines and on a selected one of the column select lines for conveying signals between the phototransducer means and the predetermined signal line;

at least one configurable transistor, the configurable transistor being independent of the switching means; and means for coupling the configurable transistor to selected ones of the plurality of auxiliary lines and, selected ones of the plurality of signal lines in order to implement a peripheral circuit within the pixel element; wherein the plurality of signal lines includes a first plurality of signal lines and a second plurality of signal lines, wherein the configurable transistor is coupled between one of the first plurality of signal lines and one of the second plurality, *and* wherein the configurable transistor is responsive to the selected row select line such that when the selected row select line is asserted, the configurable transistor couples the one of the first plurality of signal lines to the one of the second plurality of signal lines.

14. In an imaging array comprising means for generating light of a particular wavelength in response to radiation of a different wavelength and one or more photodetector arrays, wherein the means for generating light is positioned in proximity to a photodetector array, the improvement comprising a photodetector array comprising:

a plurality of select lines;

a plurality of signal lines;

an array of pixel elements, each pixel element including;

photodetector means for detecting light at the particular wavelength;

switching means coupled between the photodetector means and one of the plurality of signal lines; wherein the switching means is responsive to signals on one of the plurality of select lines for conveying signals between the photodetector and the one signal line;

at least one configurable transistor in each of a plurality of pixel elements, [the] *each* configurable transistor *having a plurality of terminals adapted to establish connections among ones of the plurality of configurable transistors, the configurable transistors* being independent of the switching means; and

[means for coupling a plurality of configurable transistors on a respective plurality of pixel elements to implement peripheral circuitry within the photodetector array of pixel elements.]

*a plurality of connection devices which connect selected ones of the terminals of the plurality of configurable transistors to form an arbitrary multi-transistor circuit which is distributed across a plurality of the pixel elements in the pixel array.*

* * * * *